US012597891B2

(12) United States Patent
Herman

(10) Patent No.: US 12,597,891 B2
(45) Date of Patent: Apr. 7, 2026

(54) CASCODED HIGH-VOLTAGE AMPLIFIER

(71) Applicant: Advanced Energy Industries, Inc.,
Denver, CO (US)

(72) Inventor: Donnie William Herman, Olcott, NY
(US)

(73) Assignee: Advanced Energy Industries, Inc.,
Denver, CO (US)

( * ) Notice: Subject to any disclaimer, the term of this
patent is extended or adjusted under 35
U.S.C. 154(b) by 470 days.

(21) Appl. No.: 18/309,421

(22) Filed: Apr. 28, 2023

(65) Prior Publication Data

US 2024/0364278 A1 Oct. 31, 2024

(51) Int. Cl.
H03F 3/04 (2006.01)
H03F 1/22 (2006.01)

(52) U.S. Cl.
CPC ...................................... H03F 3/04 (2013.01)

(58) Field of Classification Search
CPC ............. H03F 3/04; H03F 2203/30084; H03F
2203/30117; H03F 3/3001; H03F 3/45475
USPC .......................................... 330/291, 310–311
See application file for complete search history.

(56) References Cited

U.S. PATENT DOCUMENTS

| | | | | |
|---|---|---|---|---|
| 3,999,139 | A | | 12/1976 | Fennell |
| 4,456,889 | A | * | 6/1984 | Kumar ................. H03G 1/0029 |
| | | | | 330/136 |
| 5,440,249 | A | | 8/1995 | Schucker |
| 5,696,459 | A | | 12/1997 | Neugebauer |

| | | | |
|---|---|---|---|
| 8,754,712 | B2 | 6/2014 | Seebacher |
| 10,056,895 | B2 | 8/2018 | Granger-Jones |
| 10,090,777 | B2 | 10/2018 | Dent |
| 10,187,013 | B2 | 1/2019 | Kovac |
| 10,511,262 | B2 | 12/2019 | Williams |
| 2011/0181360 | A1 | 7/2011 | Li et al. |
| 2011/0241685 | A1 | 10/2011 | Gudino et al. |
| 2011/0273235 | A1 | 11/2011 | Chen et al. |
| 2013/0057349 | A1 | 3/2013 | Jo et al. |
| 2013/0241658 | A1 | 9/2013 | Takahashi |
| 2014/0028395 | A1 | 1/2014 | Chan et al. |

(Continued)

FOREIGN PATENT DOCUMENTS

CN 102916664 B 2/2016

OTHER PUBLICATIONS

PCT, International Search Report and Written Opinion issued in
PCT/US2024/026110, Sep. 11, 2024, 14 pages.

(Continued)

*Primary Examiner* — Hieu P Nguyen
(74) *Attorney, Agent, or Firm* — NOD Law PC

(57) ABSTRACT

A cascoded high-voltage amplifier is disclosed. The amplifier can include a chain of series-coupled low-voltage amplifiers, sometimes with a common gain, where an output of each low-voltage amplifier is coupled to an input of a next low-voltage amplifier, and inputs of adjacent low-voltage amplifiers are coupled via a feedforward connection, and optionally through an impedance component. In this way, a change in the input signal can level shift the entire chain of low-voltage amplifiers through the feedforward connections. The gain of the cascoded high-voltage amplifier can be a function of the number of low-voltage amplifiers, and a high-voltage output can be achieved without seeing high-voltage drops within the amplifier.

19 Claims, 9 Drawing Sheets

(56) References Cited

U.S. PATENT DOCUMENTS

| | | |
|---|---|---|
| 2016/0254786 A1 | 9/2016 | Takahashi |
| 2017/0201217 A1 | 7/2017 | Waller, Jr. |
| 2019/0158027 A1 | 5/2019 | Williams |
| 2022/0302881 A1* | 9/2022 | Thomas ................. H03F 1/301 |
| 2024/0364281 A1 | 10/2024 | Herman |

OTHER PUBLICATIONS

International Search Report and Written Opinion received for PCT Patent Application No. PCT/US25/23769, mailed on Aug. 1, 2025, 15 pages.

* cited by examiner

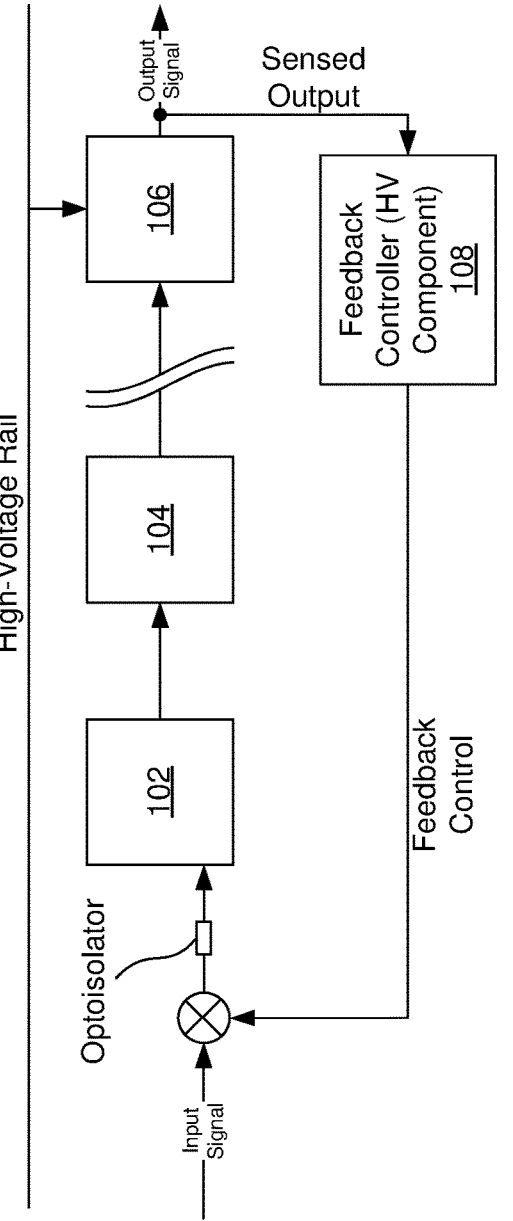
FIG. 2

700

800

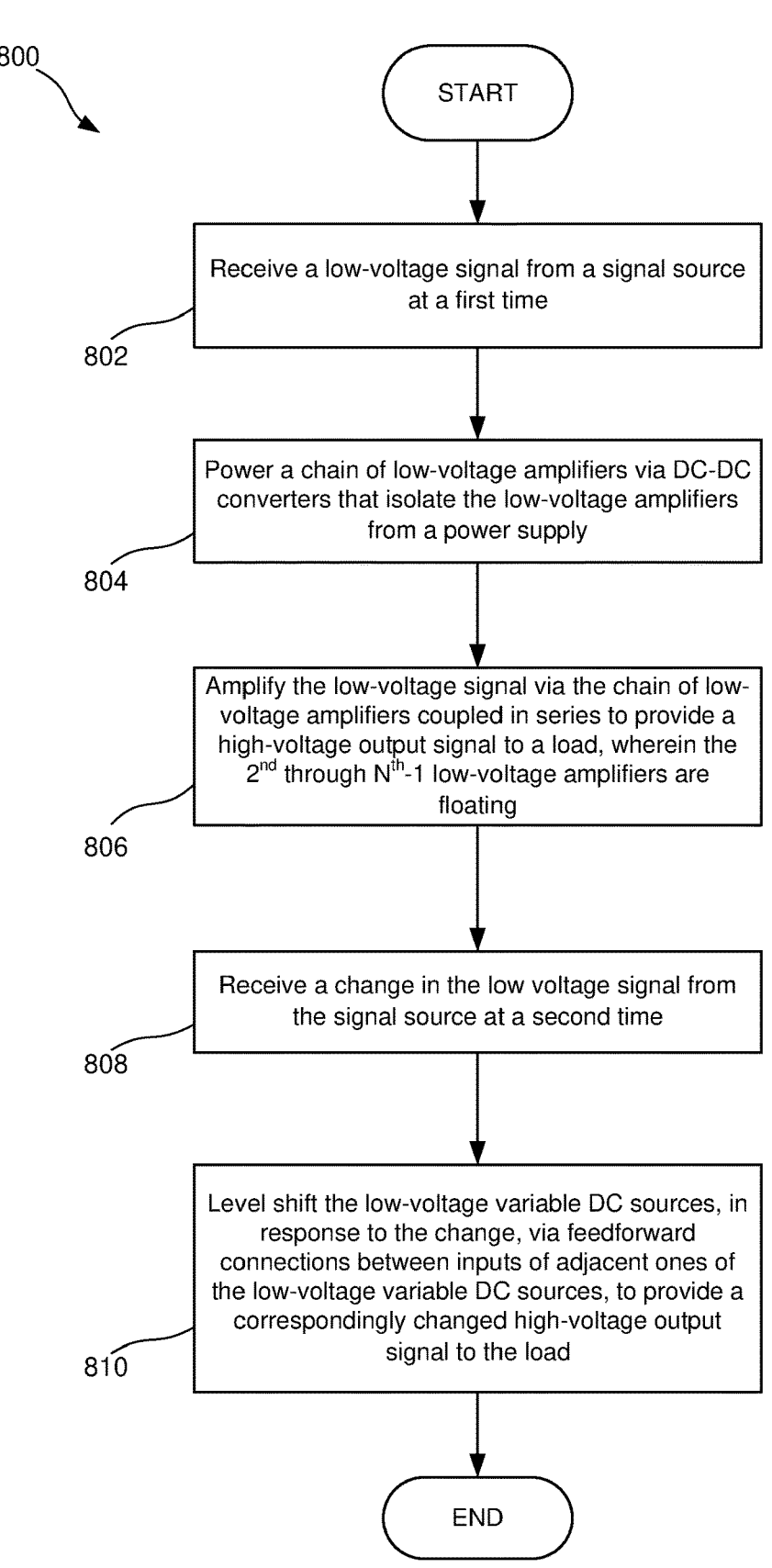

START

Receive a low-voltage signal from a signal source
at a first time

802

Power a chain of low-voltage amplifiers via DC-DC
converters that isolate the low-voltage amplifiers
from a power supply

804

Amplify the low-voltage signal via the chain of low-
voltage amplifiers coupled in series to provide a
high-voltage output signal to a load, wherein the
$2^{nd}$ through $N^{th}$-1 low-voltage amplifiers are
floating

806

Receive a change in the low voltage signal from
the signal source at a second time

808

Level shift the low-voltage variable DC sources, in
response to the change, via feedforward
connections between inputs of adjacent ones of
the low-voltage variable DC sources, to provide a
correspondingly changed high-voltage output
signal to the load

810

END

FIG. 8

CASCODED HIGH-VOLTAGE AMPLIFIER

FIELD OF THE DISCLOSURE

The present disclosure relates generally to power amplification. In particular, but not by way of limitation, the present disclosure relates to systems, methods and apparatuses for a cascoded high-voltage amplifier allowing low voltage components to be used in a high-voltage amplifier system.

DESCRIPTION OF RELATED ART

One known form of high-voltage amplifier is the AB or push-pull amplifier, using an output pulled from between a switched connection to a high voltage rail and a switched connection to ground or an opposite polarity high voltage rail (see FIG. 1). The input signal alternately activates the first and second switches to thereby replicate the input signal via the pulling high and pulling low of the output signal, each half of a cycle amplified by a corresponding one of the two switches. For increased power, each of these two switches can be replaced by a series of switches 106, a "cascoded topology," for instance as seen in FIG. 1, thereby multiplying the power handling capability proportional to the number of switches used. High-voltage components are used in this type of AB amplifier making it larger, costlier, and hotter than desired in some applications.

Although efforts have been made to improve the AB amplifier, for instance the cascoded FETs and Zener diodes in U.S. Pat. No. 10,511,262 and cascoded FETs in U.S. Pat. No. 4,697,155, such efforts still utilize mostly high-voltage components and thus cannot achieve a significant cost and size reduction.

The cascoded topology seen in FIG. 2 used a series of amplifiers to convert an input signal to an output signal, where feedback from the output signal was used by a feedback controller 108 to influence the signal provided to the first amplifier 102. A high voltage rail provided power to the last amplifier 106 in the chain. However, this high-voltage amplifier used multiple high-voltage components, such as the feedback controller 108 and needed an optoisolator between the feedback loop and the first amplifier 102. Thus, even this design left room for improving a high-voltage amplifier.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

In one aspect, the disclosure describes series-connected amplifiers or variable DC sources that change their voltage concurrently in series. Feedforward connections between amplifiers communicate an input signal upstream and this feedforward network eliminates the need for parallel high-voltage opto-couplers on each cell or stage. Because the cells are arranged in a cascode, and because each amplifier is controlled by voltage from a previous amplifier and also produces a voltage, the system can be referred to as a cascoded high-voltage amplifier or cascoded voltage-controlled-voltage-source high-voltage amplifier.

In one aspect, a cascoded amplifier is disclosed including a series of amplification cells arranged sequentially such that an output of an $N^{th}$ cell in the chain is provided to an immediately following cell (e.g., both inputs of the immediately following cell) via a resistor network (e.g., two voltage dividers). The input of an $N^{th}$ cell can be provided to an input of the immediately following cell to provide level shifting of one cell to the next via feedforward links. In other words, each cell's output is coupled to the input of the next two cells. In an embodiment, the resistor networks are selected so that every cell exhibits substantially a common gain, A (such as 2, 4, or 8), and via feedforward biases between adjacent cells, cause equal level shifting from cell to cell, thereby causing a final cell to provide a high-voltage amplified version of the input signal that is $N*A$ times greater than the input signal. While the first cell can have a grounded input, all subsequent cells are floating. The resulting high voltage amplifier achieves $N*A$ amplification without a high-voltage (e.g., greater than 50V) drop across components of the cascoded amplifier and without high-voltage isolation between the cells (e.g., no optoisolators are needed to isolate cells from each other). Said another way, this topology allows high voltage amplification using exclusively low-voltage components.

Some embodiments of the disclosure may be characterized as a high-voltage amplifier. The high-voltage amplifier can be a cascaded high-voltage amplifier in some embodiments. The high-voltage amplifier can include a voltage input, first and second amplifying cells, and an $N^{th}$ amplifying cell. The voltage input can be configured to receive an input voltage. The first amplifying cell can comprise a first amplifier coupled to the voltage input via a first input and having a first output, and can be configured to amplify the input voltage with a first gain to provide an amplified version of the input voltage at the first output. The second amplifying cell can comprise a second amplifier having a second output and can be configured to amplify the first output by a second gain. The second amplifying cell has a first feedforward connection between the first input of the first amplifier and a first input of the second amplifier. The $N^{th}$ amplifying cell can comprise an $N^{th}-1$ amplifier configured to output a high voltage version of the input voltage, wherein N is a number of amplifying cells, and wherein at least the second and $N^{th}$ amplifying cells are provided power while being isolated from a grounded source of the power.

Other embodiments of the disclosure may also be characterized as an amplifier comprising a voltage input, a first variable DC source, a second variable DC source, and an $N^{th}$ variable DC source. The voltage input can be configured to receive an input. The first variable DC source can be coupled to the voltage input and can have a first output. The first variable DC source can have a first gain, and can be configured to amplify the input voltage and to provide an amplified version of the input voltage at the first output. The second variable DC source can be configured to amplify the first output. The $N^{th}$ variable DC source can be configured to amplify an output of an $N^{th}-1$ variable DC source and to output a high-voltage version of the input voltage. N is a number of variable DC sources in the amplifier. Feedforward connections between adjacent ones of the variable DC sources level shift subsequent variable DC sources in response to changes to the input voltage.

Other embodiments of the disclosure can be characterized as a method including receiving a low-voltage signal from a signal source at a first time; powering a chain of N low-voltage amplifiers via voltage regulators that are isolated from a power supply of the voltage regulators; amplifying the low-voltage signal via the chain of low-voltage amplifiers coupled in series to provide a high-voltage output signal to a load, wherein the second through $N^{th}$−1 low-voltage amplifiers are floating; receiving a change in the low-voltage signal from the signal source at a second time; and level shifting the low-voltage amplifiers, in response to the change, via feedforward connections between inputs of adjacent ones of the low-voltage amplifiers, to provide a correspondingly changed high-voltage output signal to the load.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 2 illustrates a cascoded amplifier addressing certain issues identified in known cascoded A-B amplifier topologies;

FIG. 8 illustrates a method of amplifying a low voltage to a high voltage.

DETAILED DESCRIPTION

Figure 1:
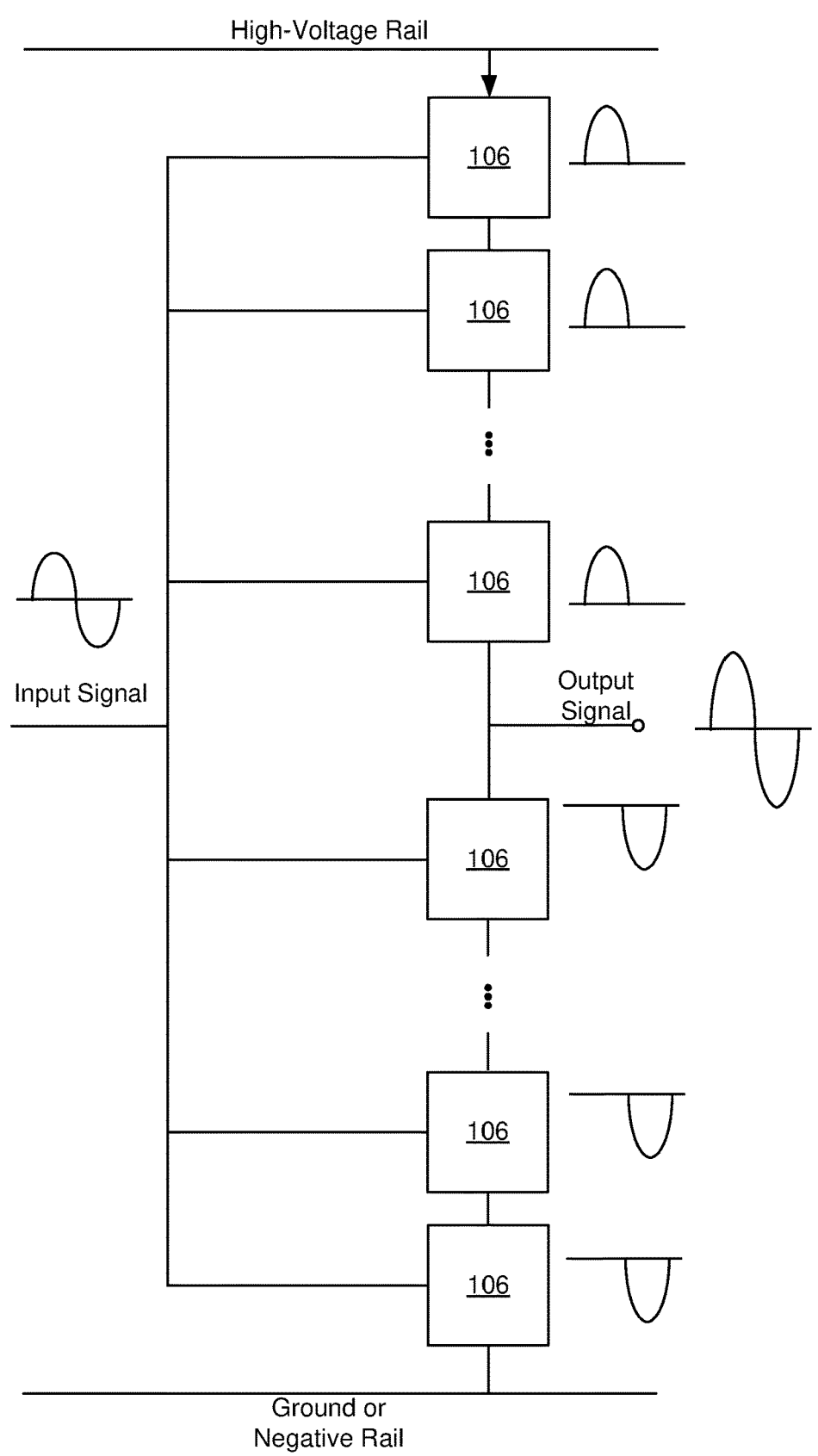
FIG. 1 illustrates a common topology for a cascoded A-B amplifier known in the art.

Prior to describing the embodiments in detail, it is expedient to define terms as used in this document.

The word "exemplary" is used herein to mean "serving as an example, instance, or illustration." Any embodiment described herein as "exemplary" is not necessarily to be construed as preferred or advantageous over other embodiments.

The flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the amplifier in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The amplifier may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups but do not preclude the presence or addition of one or more other features, integers, steps, operations, elements, components, and/or groups thereof. As used herein, the term "and/or" includes any and all combinations of one or more of the associated listed items, and may be abbreviated as "/".

Embodiments of the disclosure are described herein with reference to illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

For the purposes of this disclosure, "coupled to" means an electrical path between two nodes, regardless of the impedance of that path and whether current passes through one or more impedance components between the two nodes. For instance, an output of a low-voltage amplifier may be coupled to an input of a next or subsequent or adjacent low-voltage amplifier whether or not this electrical path includes an impedance component such as a resistor.

For the purposes of this disclosure, a voltage-controlled voltage source, can include, but is not limited to, an amplifier, class D amplifier, variable power source or supply, variable DC source, DC-DC converter, signal booster, op amp, differential pair, or symmetrical circuit.

Figure 3:
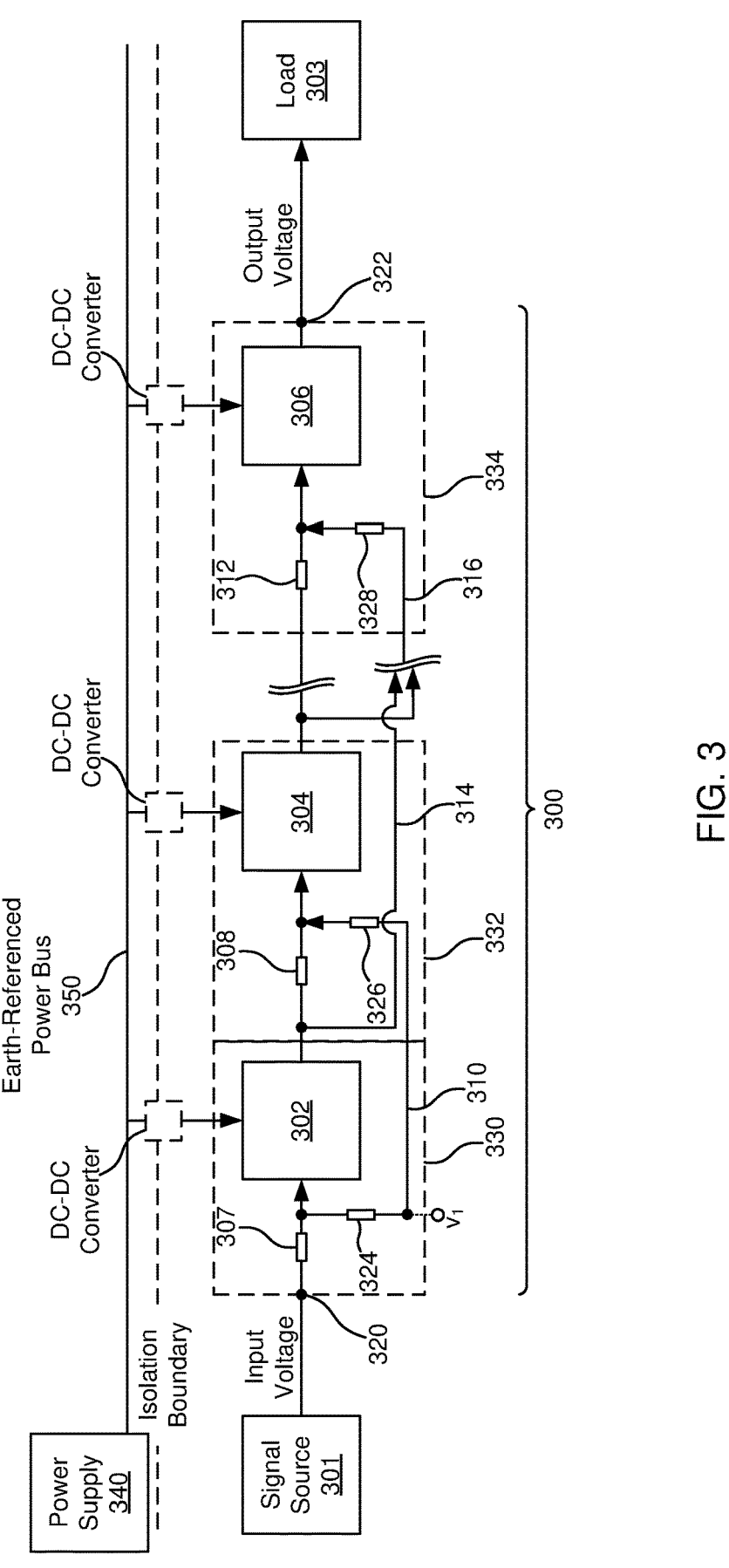
FIG. 3 illustrates a generalized embodiment of a cascoded high-voltage amplifier that converts a low voltage input signal to a high-voltage output signal using N series-coupled low voltage cells.

FIG. 3 illustrates a generalized embodiment of a cascoded high-voltage amplifier that converts a low voltage input signal to a high-voltage output signal using N series-coupled low-voltage amplifiers. N is a total number of low-voltage amplifier cells in the cascoded high-voltage amplifier 300. The low-voltage amplifiers 302, 304, 306, other than the first and last or $N^{th}$, are floating. Each low-voltage amplifier 302, 304, 306 is also powered or biased by an earth-referenced power supply. For instance, in FIG. 3, a power supply 340 provides an earth-referenced power bus 350 with voltage such as 15V, where this earth-referenced power bus 350 is isolated from the cascoded high-voltage amplifier 300 via an isolation boundary. In some embodiments, the isolation boundary may be embodied in transformer, for instance as part of DC-DC converters or regulators, though other forms of isolation can also be implemented. The floating low-voltage amplifiers and the earth-referenced power supply that is isolated from the low-voltage amplifiers, along with a feedforward connection 310, 314, 316 between inputs of adjacent low-voltage amplifiers 302, 304, 306, allows a change in the input signal to the cascoded high-voltage amplifier 300 to level shift the entire chain of low-voltage amplifiers 302, 304, 306. In other words, a change to an input to the cascoded high-voltage amplifier 300 propagates through the entire cascoded high-voltage amplifier 300 with little if any delay or latency. At the same time, the floating nature of all but the first and last (or $N^{th}$) low-voltage amplifiers means that voltage differences between low-voltage amplifiers can be limited to "low voltage" such as, less than or equal to 50V, or only using components tailored to or rated to up to 50V. This allows most if not all of the cascoded high-voltage amplifier 300 to be constructed using common and inexpensive off-the-shelf low voltage components, yet achieve high voltage amplification (e.g., 1V in and 60V out, or 1V in and 120V out, or 1V in and 1 KV out, etc.).

In some embodiments, each low-voltage amplifier 302, 304, 306 can have at least one input that is biased or controlled by an impedance network (having at least two impedance components in FIG. 3). For instance, in FIG. 4, each impedance network includes four resistors. The combination of a low-voltage amplifier, the impedance network, and a feedforward connection can form a low-voltage amplifier cell, of which a first 330, a second 332, and an $N^{th}$ 334 (or last) are shown in FIG. 3—though some number of optional additional cells are not shown for the sake of simplicity. At a minimum, a cascoded high-voltage amplifier can include two cells and thus two amplifiers, though at least three are shown in FIG. 3. The number of cells and low-voltage amplifiers is not limiting, though cost, size, and complexity may steer designers toward a minimum number, which the inventor believes is achieved when each cell has a gain of 2.

Like the low-voltage amplifiers other than the first and $N^{th}$ or last, the low-voltage amplifier cells, except the first and $N^{th}$ or last, are floating. This, along with isolated from the power supply 340, and the feedforward connections 310, 314, 316, means that the cascoded high-voltage amplifier 300 can respond to changes in input signal using low voltage cells. In other words, the impedance networks and feedforward connections can also use components tailored for low voltage operation or rated up to 50V, which are often off-the-shelf and low-cost components.

Additionally, it should be noted that since the voltage drop across any one low-voltage amplifier 302, 304, 306 or low-voltage amplifier cell 330, 332, 334 is low voltage (i.e., less than or equal to 50V), power dissipation is relatively low and evenly distributed across the cascoded high-voltage amplifier 300. In case where the chain of cells gets too long in a certain direction, for instance, from a packaging standpoint, the chain can follow a u-shaped or s-shaped path to keep the package in a relatively square shape or a rectangle with relatively similarly sized edges. Further, circuit boards can be stacked in order to add even more cells while still maintaining a relatively compact overall high-voltage amplifier package.

The discussion now turns to additional details of the embodiment shown in FIG. 3 that help illuminate operation of the cascoded high-voltage amplifier without limiting a cascoded high-voltage amplifier more generally. The cascoded high-voltage amplifier 300 can include a voltage input 320 that may or may not be a part of the first cell 320. The voltage input 320 can be configured for coupling to a signal source 301 and is configured to receive an input voltage or input signal from the signal source 301. In some instances, an input voltage or input signal at the voltage input 320 can be a DC signal, while in others it can be an AC, pulsed DC, or arbitrary waveform. In other words, any voltage signal can be received at the voltage input 320 and amplified by the cascoded high-voltage amplifier 300. In this same vein, the signal source 301 should not be considered limiting of the cascoded high-voltage amplifier 300. Similarly, high and low frequency input voltages or signals can be implemented at the voltage input 320.

A voltage output 322 for the cascoded high-voltage amplifier 300 may or may not be a part of the last or $N^{th}$ amplifier cell 334, and the voltage output 322 can be configured for coupling to a load 303 such as a speaker's voice coil, a digital circuit on a circuit board, an electrode in a plasma processing chamber, or the rotor or stator of an electrical motor, to name just a few non-limiting examples. In other words, the cascoded high-voltage amplifier 300 can be coupled between a signal source 301, and a load 303. Electrical connections well known to those of skill in the art can be made between (1) the signal source 301 and the cascoded high-voltage amplifier 300, and (2) between the cascoded high-voltage amplifier 300 and the load 303.

A high-voltage signal at the voltage output 322 can be an amplified version of the input signal at the voltage input 320, where a ratio of the output voltage over the input voltage, or the output signal over the input signal, or the signals at the voltage output 322 over that at the voltage input 320, can be called the amplifier gain. The amplifier gain is larger than a gain of any one of the low-voltage amplifier cells 330, 332, 334, and in many cases will be a sum of the gains of each of the low-voltage amplifier cells 330, 332, 334. In other words, a last or $N^{th}$ low-voltage amplifier cell 334 in the chain, can include an Nth low-voltage amplifier 306 configured to output a high-voltage version of the input voltage.

The low-voltage amplifiers 302, 304, 306, can be, but are not limited to, a variable DC source, class D amplifier, variable power source or supply, voltage-controlled voltage source, DC-DC converter, signal booster, op amp, differential pair, symmetrical circuit, etc. In some cases, the low-voltage amplifiers 302, 304, 306 can be voltage sources, though current and power sources can also be implemented. It should also be understood that the low-voltage amplifiers 302, 304, 306 are not limited in response time, and can therefore provide low-latency signal tracking of pulsed DC, AC, and arbitrary waveforms, to name a few. In some cases, digital amplifiers can be used for the low-voltage amplifiers 302, 304, 306 where higher frequency input signals are used (e.g., greater than 5 MHz). In some cases, the low-voltage amplifiers 302, 304, 306 can be replaced with high-voltage amplifiers, such as those using components rated to greater than 50V. These situations may be seen where an especially large output voltage is desired.

In some cases, the first low-voltage amplifier 302 is different than the remaining low-voltage amplifiers 304, 306 or may not even be an amplifier. For instance, a buffer or other device having a gain of 1 could be used in place of the low-voltage amplifier 302. Said another way, the first amplifying cell 130 has a gain of 1 and subsequent amplifying cells have a gain greater than 1. Similarly, the low-voltage amplifiers 302, 304, 306 may have the same gain, while in other situations different gains may be used. In one embodiment, the second through last or $N^{th}$ low-voltage amplifier 304, 306 have a gain of 2, while in another embodiment, all of the low-voltage amplifiers 302, 304, 306 have a gain of 2.

Each low-voltage amplifier cell 330, 332, 334 can have an input and an output. The first low-voltage amplifier cell 330 can be configured to amplify the input voltage with a first gain to provide an amplified version of the input voltage at the first output of the first low-voltage amplifier 302, which can be provided to an input of the second low-voltage amplifier cell 332. The second low-voltage amplifier cell 332 can include a second low-voltage amplifier 304 configured to amplify the first output by a second gain. The second low-voltage amplifier cell 332 can include a first feedforward connection 310 between the first input of the first low-voltage amplifier 302 and a first input of the second low-voltage amplifier 304. The first input of the second low-voltage amplifier 304 can be formed by a sum the output of the first low-voltage amplifier 302 and the first feedforward connection 310. For instance, this summing can be performed by a voltage divider comprising impedance components 308 and 326. In an embodiment, the output of the first low-voltage amplifier 302 can be coupled to the first input of the second low-voltage amplifier 304, and the input of the first low-voltage amplifier 302 can be coupled to the first input of the second low-voltage amplifier 304. This coupling can be made via a voltage divider such that the second low-voltage amplifier 304 is at a voltage less than the output of the first low-voltage amplifier 302 but greater than the input of the first low-voltage amplifier 302. Said another way, the output of the first low-voltage amplifier 302 is coupled to the input of the second low-voltage amplifier 304 via an impedance component 308, such that voltage actually drops between an output of one low-voltage amplifier and an input of a next low-voltage amplifier. Thus, while the overall cascoded high-voltage amplifier 300 amplifies the input signal at input voltage 320, voltage actually drops between low-voltage amplifiers.

As noted, the first low-voltage amplifier 302 or low-voltage amplifier cell 330 can be grounded. FIG. 3 shows the first feedforward connection 310 being optionally held at voltage $V_1$, which in some cases is ground. However, more importantly, the first feedforward connection 310 can be held to whatever voltage the signal source 301 is referenced to, which may be ground, but may also be some non-zero voltage.

Figure 4:
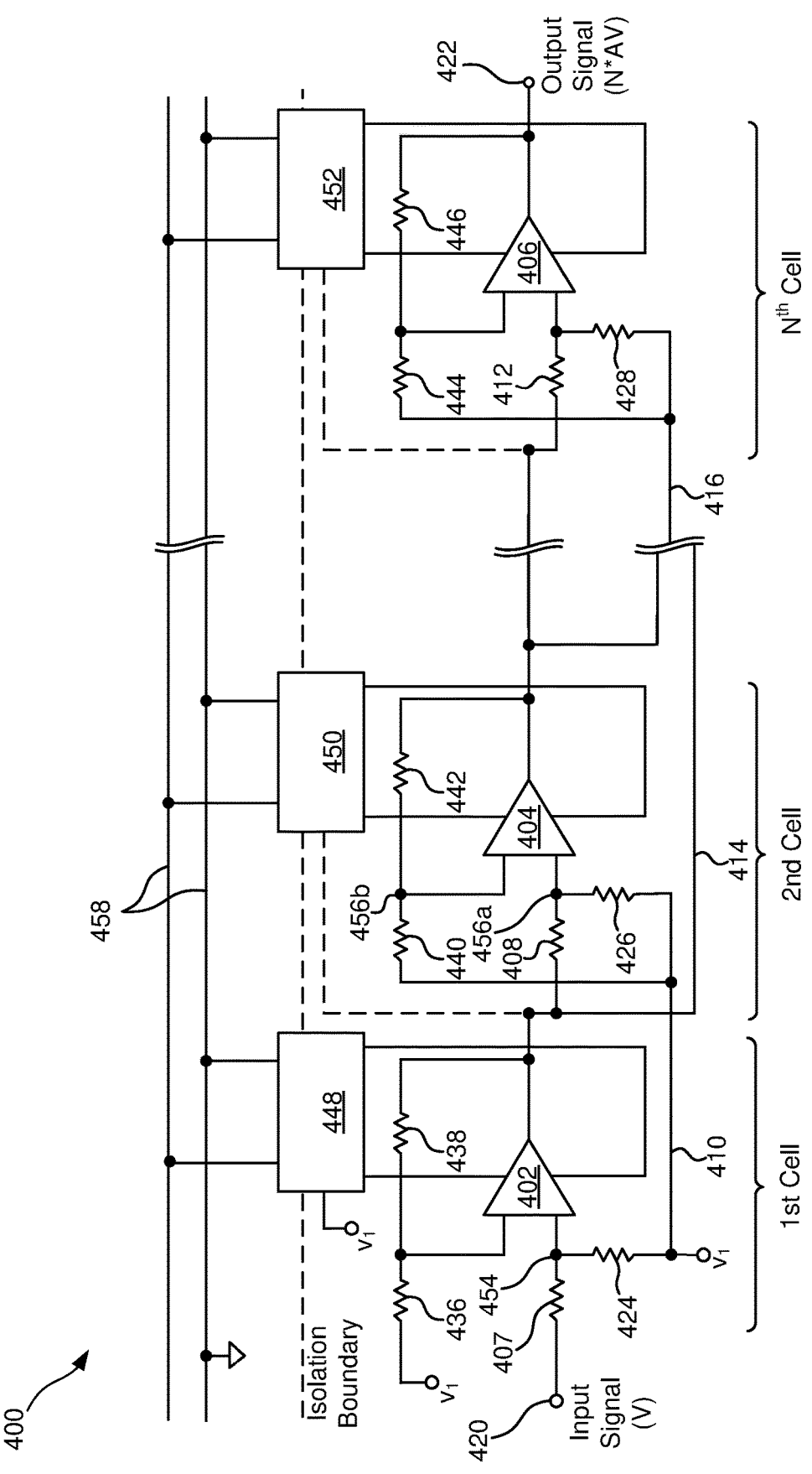
FIG. 4 illustrates another embodiment of a cascoded high-voltage amplifier.

Each feedforward connection 310, 314, 316 may pass through an impedance component (e.g., 326, 328) in route to an input of a next low-voltage amplifier. Similarly, each output of a low-voltage amplifier 302, 304, 306 or low-voltage amplifier cell 330, 332, 334 may pass through an impedance component (e.g., 308, 312) in route to the input of the next low-voltage amplifier. Said another way, each low-voltage amplifier except the $N^{th}$ or last one, can be coupled to a next or next adjacent low-voltage amplifier via an impedance component. The impedance components can include resistors or other resistive devices, though reactive components and components having both resistive and inductive components could also be implemented. In other terms, devices seeing a voltage drop can be implemented as the impedance components so long as they are selected to achieve a desired voltage drop from low-voltage amplifier output to low-voltage amplifier input that achieves a desired gain across a respective low-voltage amplifier cell (i.e., from one low-voltage amplifier output to an output of a next low-voltage amplifier). The impedance components 307, 324, 308, 326, 312, 328 can be part of impedance component networks, one impedance component network for each low-voltage amplifier cell 330, 332, 334 or each low-voltage amplifier 302, 304, 306. In FIG. 3 the impedance component network comprises two impedance components, though more could be implemented as shown in FIG. 4. It should be appreciated that although an impedance component network is shown in FIGS. 3 and 4, in certain embodiments, such an impedance component network may not be needed (e.g., see FIG. 6).

Isolation, and thus the ability of all but the first and last or Nth low-voltage amplifier cells to be floating, is an important feature that allows the low-voltage amplifier gains to sum and generate a high-voltage output. As noted earlier, the low-voltage amplifier cells 332, 334, except the first low-voltage amplifier cell 330 are each provided with power isolated from a grounded source of the power (e.g., power supply 340). In other words, all but a first low-voltage amplifier cell 330 in the chain is floating and receives power from DC-DC converters that are isolated or include isolation from, the power supply 340. Packaging for the cascoded high-voltage amplifier 300 may also support the isolation boundary, for instance a PCB without any conductive traces that cross the isolation boundary, or a PCB with elongated slits formed therein in a zigzagging pattern may reduce a cross section of the PCT spanning the isolation boundary thereby increasing dielectric resistance at the isolation boundary. In FIG. 3 one sees that each low-voltage amplifier cell 330, 332, 334 receives power from an earth-referenced power bus 350, and is also isolated from the earth-referenced power bus 350 and the source of power to the earth-referenced power bus 350 (e.g., the power supply 340). Although not explicitly illustrated, these isolated DC-DC regulators can be regulated such that a specific voltage is provided to each of the low-voltage amplifiers 302, 304, 306. Interestingly, the earth-referenced power bus 350 does not need to be high voltage (e.g., greater than 50V). For instance, if the input signal is 10V, the gain of each low-voltage amplifier is 2 or 20V, then a 25V earth-referenced power bus 350 could be used, and with enough low-voltage amplifier cells, the output could be many hundreds or even thousands of volts. For instance, 50 low-voltage amplifier cells would enable a 1000V output despite the earth-referenced power bus 350 being a mere 25V. As those of skill in the art will appreciate, the ability to achieve high voltage outputs with only low-voltage rails/buses and power supplies is a huge cost, size, and complexity advantage over the prior art.

Further, feedforward connections 310, 314, 316 between adjacent low-voltage amplifier cells 330, 332, 334 level shift the entire chain of low-voltage amplifier cells 330, 332, 334 without high-voltage isolation (such as optoisolators) along the feedforward connections 310, 314, 316. At the same time, isolation, floating cells, and the feedforward connections enable the cascoded high-voltage amplifier 300 is able to avoid or minimize use of high-voltage components and high-voltage isolation for a cooler-running and more compact form factor than is known in the art. What is more, by distributing amplification duties across N low-voltage amplifier cells, this disclosure more evenly achieves spatial distribution of thermal effects thereby avoiding hot spots in the cascoded high-voltage amplifier 300. Further, by removing optoisolators, the disclosure removes delays associated with signals that have to pass through optoisolators, thus making the cascoded high-voltage amplifier 300 more responsive to respond to input signals and transients.

Each low-voltage amplifier cell 330, 332, 334 can be configured to amplify an input voltage to that cell (in the case of all but the first low-voltage amplifying cell, this would be the output of the previous low-voltage amplifier cell). In some cases, all low-voltage amplifier cells 330, 332, 334 can have the same gain, referred to as A. In other cases, different low-voltage amplifier cells 330, 332, 334 may have different gains, for instance the first low-voltage amplifier cell 330 can have a gain B and the remaining low-voltage amplifier cells 332, 334 can have the gain A. The gain A, whether equal to B or not, can equal 2. However, the gain A (and optionally B as well) can be greater than 2 and in some cases can be an exponential of 2 (i.e., $2^C$, where C is a positive integer), such that A (and optionally B) can equal 2, 4, 8, 16, etc. In some embodiments, the gain A (and optionally B) can equal $2^C$ and be less than a ratio of the output voltage over the input voltage. For instance, where the input voltage is 1V and the output voltage is 500V, C can be any positive integer such that $2^C<500/1$ (i.e., C is a positive integer less than 9) and hence there could be up to 256 amplifying cells ($2^9$). In other words, the first and second gain are equal to $2^C$ and less than the output voltage/the input voltage, where C is a positive integer. Regardless of the gain of each low-voltage amplifier cell 330, 332, 334 or the number N of low-voltage amplifier cells, the serial topology of the low-voltage amplifier cells 330, 332, 334 means that a common current is seen at the output of each low-voltage amplifier 302, 304, 306.

The number N of low-voltage amplifier cells 330, 332, 334 is not limited, but preferably will be equal to a total gain of the cascoded high-voltage amplifier 300 divided by at least a maximum voltage to be seen across any given low-voltage amplifier cell 330, 332, 334. For example, where a 1000V output is desired from a 1V input, and 50V is considered the desired cutoff for each cell to be considered "low voltage", at least 20 low-voltage amplifier cells would be used. However, in some embodiments, this same topology can apply to situations where some or all of the low-voltage amplifier cells may not be considered low voltage, for instance, where a voltage across each cell is 75V, or 250V, or some other higher value above 50V. Such a compromise of the low voltage nature may be worthwhile for higher output voltage embodiments of the cascoded high-voltage amplifier 300.

FIG. 4 illustrates an embodiment of a cascoded high-voltage amplifier where each low-voltage amplifier is biased by a resistor network. In this embodiment, the low-voltage amplifiers are implemented as op amps 402, 404, 406, biased by a resistor network, each op amp 402, 404, 406 plus 4-piece resistor network forming an amplifying cell. Each op amp 402, 404, 406 has two inputs and an output. Inputs of adjacent op amps 402, 404, 406 are coupled via a feedforward connection 410, 414, 416, and each op amp's output is coupled to an input of a next or subsequent op amp 402, 404, 406, through a resistor, except the last or $N^{th}$ op amp 406, whose output is, or is connected to, the output 422 of the cascoded high-voltage amplifier 400. More specifically, a first input 454 of the first op amp 402 is coupled to both the first and second inputs 456a and 456b of the second op amp 404. The first feedforward connection 410 to the first input 456a of the second op amp 404 passes through resistor 426, while the first feedforward connection 410 to the second input 456b of the second op amp 404 passes through resistor 440. The output of the first op amp 402 passes through resistor 408 to the first input 456a of the second op amp 404 and also couples to the second feedforward connection 414.

During steady state operation, both inputs of each op amp 402, 404, 406 are equal or balanced and the gain of each op amp 402, 404, 406 is set via the corresponding resistor network (e.g., 407, 424, 436, 438 for the first op amp 402 and 408, 426, 440, 442 for the second op amp 404). Each resistor network is formed from two voltage dividers, one for each of the op amp inputs. While the feedforward connection 410 of the first low-voltage amplifier cell is grounded, all subsequent feedforward connections such as the second feedforward connection 414 and the $N^{th}$ feedforward connection 416, are floating.

Where the gain of each op amp 402, 404, 406 is equal, the resistor networks can use the same resistance values. For instance, where a gain of 2 is used, the resistors of the first and second low-voltage amplifier cells can be as follows, where R is an arbitrary resistance: 436, 407, 440, 408=R and 438, 410, 442, and 426=2R. Although this example uses a relationship between resistors of 2R to obtain a gain of 2, other ratios can also be used to achieve other gains. Additionally, the resistor values for the entire resistor network of a low-voltage amplifier cell can be adjusted while maintaining a ratio and thus a gain in order to optimize bandwidth and efficiency. For instance, reducing resistor values gives greater bandwidth but lower efficiency. In one non-limiting example, the resistors 436, 407, 440, 408 can equal 1000 Ohms, while the resistors 438, 410, 442, and 426 can equal 2000 Ohms.

Each op amp 402, 404, 406 can be biased by a DC-DC converter 448, 450, 452, where each of these DC-DC converters 448, 450, 452 are isolated from an earth-referenced power bus 458. For instance, each DC-DC converter 448, 450, 452 can use a transformer to both down convert voltage from the earth-referenced power bus 458 as well as provide isolation from the 'high-voltage' side of the isolation boundary (it should be noted that the earth-referenced power bus 458 may also be low voltage). The first earth-referenced power bus 448 may be referenced to voltage $V_1$ (e.g., ground) and thus may not need internal isolation structures such as a transformer. Although a transformer is one means of converting the earth-referenced power bus voltage to a voltage for use within each of the low-voltage amplifier cells, other conversion topologies such as switching converters, etc. can also be used. The first feedforward connection 410 as well as a second input to the first low-voltage amplifier cell are both held to voltage $V_1$, or the same reference voltage as the first DC-DC converter 448. In some cases, $V_1$ is ground, but this is not required. Accordingly, the first low-voltage amplifier cell and the first low-voltage amplifier 402 are not floating, but rather have a fixed reference voltage, $V_1$. The remaining low-voltage amplifier cells and low-voltage amplifiers except the last or $N^{th}$ are floating. The last or $N^{th}$ low-voltage amplifier cell and low-voltage amplifier are referenced to a load once coupled thereto.

The second through $N^{th}$ low-voltage amplifier cells can include an optional bias line between a respective one of the DC-DC converters 450, 452 and a common node (e.g., the common node for the first or second low-voltage amplifier cells is effectively the output of the first low-voltage amplifier 402 and the node preceding the resistance 408). These optional bias lines enable a given DC-DC converter to bias a corresponding low-voltage amplifier relative to the common node preceding that low-voltage amplifier.

In this embodiment, a first two cells and an $N^{th}$ cell are shown for simplicity, but those of skill in the art will appreciate that any number of two or more low-voltage amplifier cells may be implemented in the cascoded high-voltage amplifier based on the teachings in FIG. 4 (i.e., N is equal to or greater than 2).

Assuming a constant gain A for all of the cells, the output signal can be N*A times larger than the input signal, where N is the number of low-voltage amplifier cells in the cascoded high-voltage amplifier 400.

Figure 6:
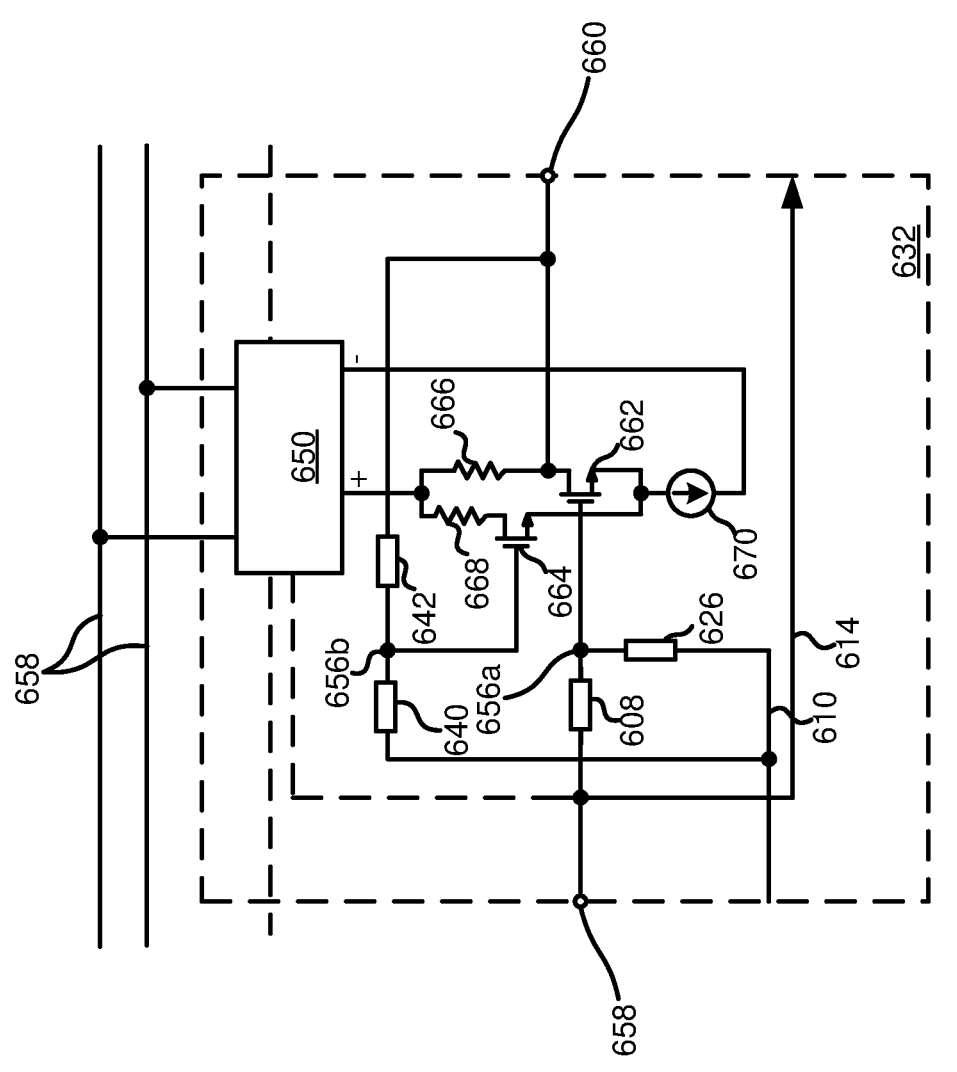
FIG. 6 illustrates an embodiment of a low-voltage amplifier using a differential pair of transistors for gain.

Although FIG. 4 uses op amps as an illustrative embodiment of the low-voltage amplifiers found in the cascoded high-voltage amplifier, other amplifiers can also be used, such as the discrete transistor-based amplifiers shown for example in FIG. 6.

Figure 5:
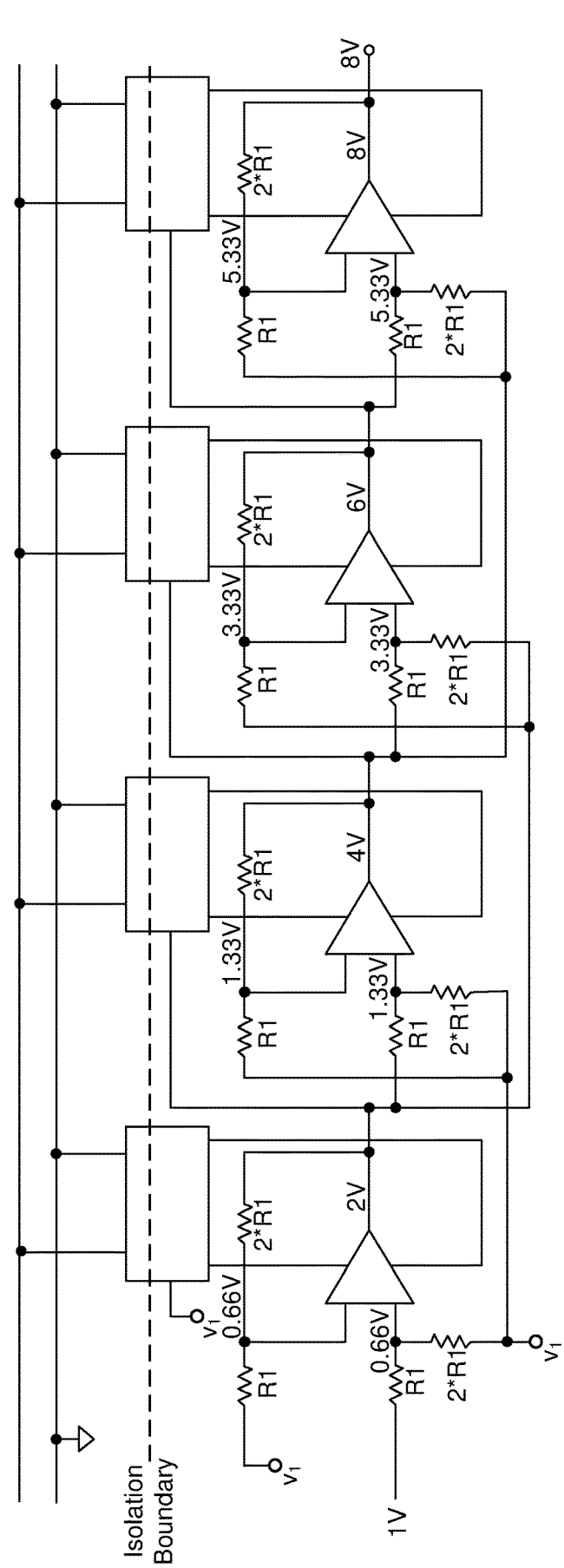
FIG. 5 illustrates another embodiment of a cascoded high-voltage amplifier showing exemplary resistance values and input and output voltages of cascoded amplifiers.

FIG. 5 shows illustrative voltages and resistances for components of the cascoded high-voltage amplifier of FIG. 4 where N=4. One will notice that a gain of 2 has been selected for each of the low-voltage amplifier cells leading to a total gain of 8 for the cascoded high-voltage amplifier. Accordingly, no more than 2V is seen between any low-voltage amplifier cells and thus low voltage components can be used throughout. The gain of each low-voltage amplifier cell is determined by the resistance values selected for the resistor network of each low-voltage amplifier cell. As seen, each resistor network includes two resistors having resistance R1, and two having resistance R2 or 2*R1. In one non-limiting example, R1=10,000 Ohms and R2=20,000 Ohms.

For the purposes of clarity, one will note that the gain of a low-voltage amplifier cell and the gain of a low-voltage amplifier are different. For instance, the gain of each low-voltage amplifier cell is 2, and the gain of each low-voltage amplifier depends on the low-voltage amplifier in question.

Figure 9:
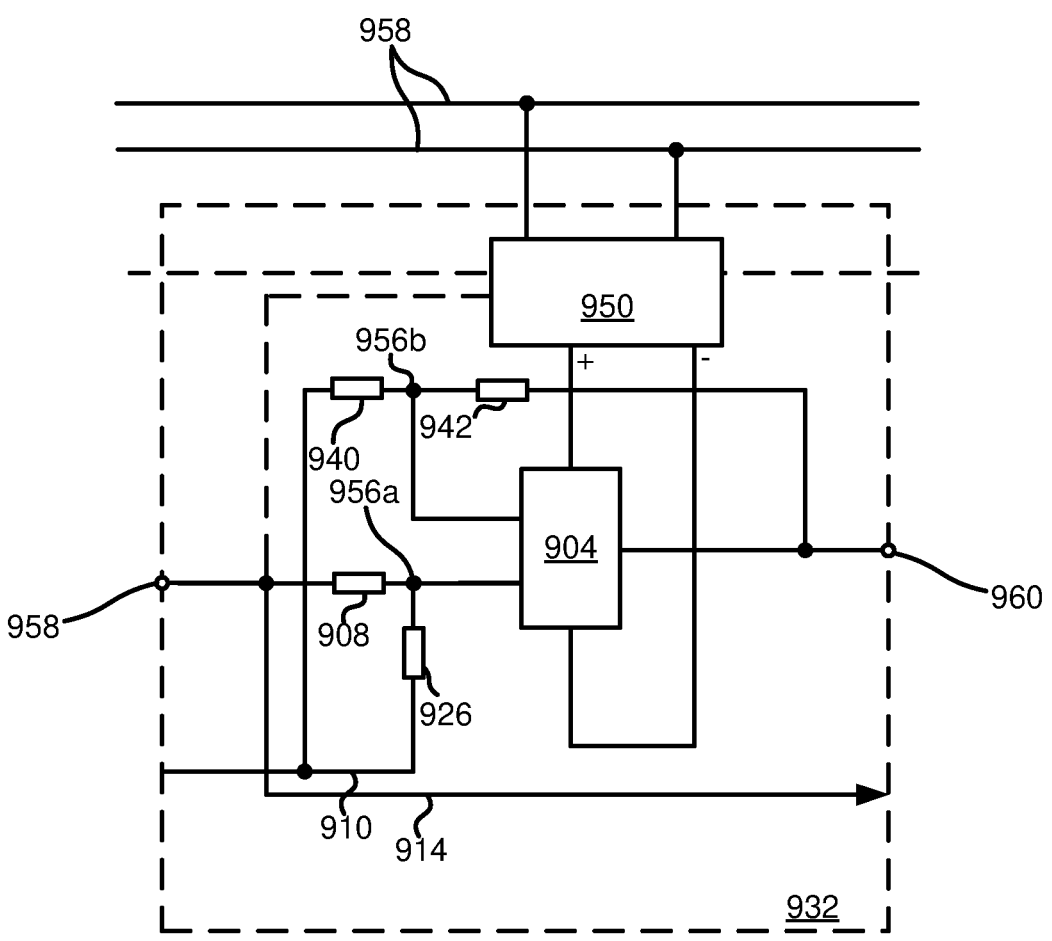
FIG. 9 illustrates an embodiment of a generic low-voltage amplifier that can be used in a chain of cells as part of a cascoded high-voltage amplifier.

FIG. 9 illustrates an embodiment of a low-voltage amplifier cell such as the ones shown in FIG. 3 (e.g., 304). In particular, this example shows a low-voltage amplifier cell that could be arranged between other low-voltage amplifier cells, such as the second low-voltage amplifier cell 304 in FIG. 3, though the teachings of this figure could easily be applied by one of skill in the art to a first or last (or $N^{th}$) low-voltage amplifier without undue experimentation. For instance, for the first or last low-voltage amplifier, one of the two feedforward connections 910, 914 would be removed. The low-voltage amplifier 904 has two inputs, a first input 956a and a second input 956b, that at steady state, will be equal in voltage. These voltages are determined by selection of values for the impedance network comprising impedances 908, 926, 940, 942, which can be resistors in one non-limiting embodiment. The impedances can be selected to control a gain of the low-voltage amplifier cell 932, as defined by a ratio of the output 960 over the input 958. Because of the impedance network, the gain of the low-voltage amplifier cell 932 is different than a gain between the first input 956a and the output 960 (or the second input 956b and the output 960).

The low-voltage amplifier 904 can be biased by high and low signals from a DC-DC converter 950 that provides isolation from an earth-referenced power bus 958.

The first input 956a can be coupled to the input 958 as well as the first feedforward connection 910 through impedances 908 and 926, respectively. In other words, the first input 956a can be biased by or coupled to an output of the previous low-voltage amplifier cell and an input of the previous low-voltage amplifier cell via the impedances 908 and 926, respectively. Similarly, the second input 956b can be coupled to the output 960 as well as the first feedforward connection 910 through impedances 942 and 940, respectively. In other words, the second input 956b can be biased by or coupled to the output 960 of the low-voltage amplifier cell 932 as part of feedback of the low-voltage amplifier cell 932 that controls balancing of the differential or balanced inputs of the low-voltage amplifier 904.

The low-voltage amplifier cell 932 also includes two feedforward connections, a first 910 and a second 914. The first feedforward connection 910 couples an input of a previous low-voltage amplifier cell to an input of the low-voltage amplifier 904 through the impedance component 926. The second feedforward connection 914 couples the input 958 of the low-voltage amplifier cell 932 to a next low-voltage amplifier cell and in particular to one of two inputs of that next low-voltage amplifier through a respective impedance component of the next low-voltage amplifier cell.

FIG. 6 illustrates an embodiment of a low-voltage amplifier cell such as the ones shown in FIG. 3 (e.g., 304). In particular, this example shows a low-voltage amplifier cell that could be arranged between other low-voltage amplifier cells, such as the second low-voltage amplifier cell 304 in FIG. 3, though the teachings of this figure could easily be applied by one of skill in the art to a first or last (or $N^{th}$) low-voltage amplifier without undue experimentation. For instance, for the first or last low-voltage amplifier, one of the two feedforward connections 610, 614 would be removed. FIG. 6 shows that the low-voltage amplifier can be embodied by discrete components, such as transistors as shown in this differential pair example. In particular, the inputs 656a and 656b respectively feed a first and second transistor 662, 664. Transistors 662, 664 are biased through resistors 666, 668, respectively, by a high signal from a DC-DC converter 650 that provides isolation from an earth-referenced power bus 658. The inputs 656a, 656b control gates of the transistors 662, 664 and thereby control an amount of current drawn through each transistor 662, 664 and provided to a low input of the DC-DC converter 650. This operation is enhanced by a current source 670 that can be embodied by a resistor in an embodiment, or more complex circuitry in other embodiments. The output 660 can be taken from either leg of the low-voltage amplifier since the differential pair produces equivalent current and voltage between the respective transistors 662, 664 and resistors 666, 668. Thus, the circuit is not limited to taking the output 660 from the node between transistor 662 and resistor 666.

Here, one sees the impedance network comprising four distinct impedance components 608, 626, 640, 642 that can be implemented as resistors in one embodiment. The impedances can be selected to control a gain of the low-voltage amplifier cell 632, as defined by a ratio of the output 660 over the input 658. Because of the impedance network, the gain of the low-voltage amplifier cell 632 is different than a gain between input 656a and output 660 (or between input 656b and output 660).

The low-voltage amplifier cell 632 also includes two feedforward connections, a first 610 and a second 614. The first feedforward connection 610 couples an input of a previous low-voltage amplifier cell 632 to a first input 656a of the low-voltage amplifier (i.e., the transistor 662) through the impedance component 662. The second feedforward connection 614 couples the input 658 of the low-voltage amplifier cell 632 to a next low-voltage amplifier cell and in particular to one of the two transistors of that next low-voltage amplifier cell through a respective impedance component thereof.

Figure 7:
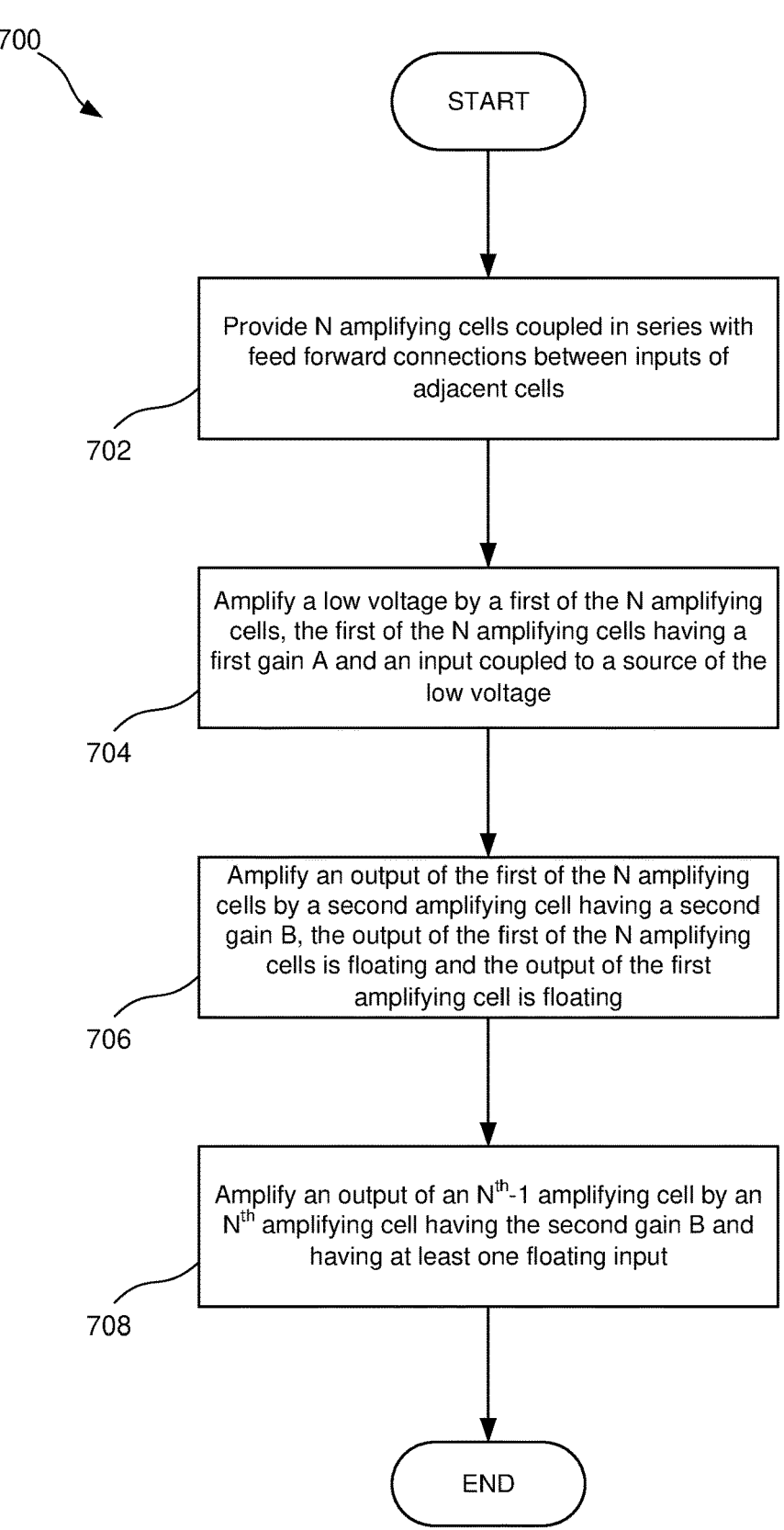
FIG. 7 illustrates a method of amplifying a low voltage to a high voltage.

FIG. 7 illustrates a method of amplifying a low voltage to a high voltage. The method 700 includes providing N amplifying cells coupled in series with feed forward connections between inputs of adjacent cells (Block 702). The method 700 further includes amplifying the low voltage by a first of the N amplifying cells, the first of the N amplifying cells having a first gain A and an input coupled to a source of the low voltage and the input coupled to a reference voltage such as ground (Block 704). The method 700 further includes amplifying an output of the first amplifying cell by a second amplifying cell having a second gain B and at least one floating input and wherein the output of the first amplifying cell is floating (Block 706). The method 700 can yet further include amplifying an output of an $N^{th}-1$ amplifying cell by an $N^{th}$ amplifying cell having the second gain B and having at least one floating input (Block 708). The second gain B can be controlled by the feedforward connections, and more specifically, by an impedance network that includes an impedance component on each feedforward connection. Changing this impedance value on the feedforward connections adjusts the gain B.

In some cases, all amplifying cells can have the same gain, referred to as A (i.e., A=B). In other cases, different amplifying cells may have different gains, for instance the first cell can have a gain B and the remaining cells can have a gain A. The gain A, whether equal to B or not, can equal 2. However, the gain A can be greater than 2 and, in some cases, can be an exponential of 2 (i.e., $2^C$, where C is a positive integer), such that A can equal 2, 4, 8, 16, etc. In some embodiments, the gain A can equal $2^C$ and be less than a ratio of the output voltage over the input voltage. For instance, where the input voltage is 1V and the output voltage is 500V, C can be any positive integer such that $2^C < 500/1$ (i.e., C is a positive integer less than 9) and hence there could be up to 256 amplifying cells ($2^9$). Regardless of the gain of each cell or the number of cells N, the serial topology of the amplifying cells means that an output of each low-voltage amplifier in each low-voltage amplifier cell sees a common current. In some embodiments, no more than 50V drops across, or can be measured across, adjacent amplifying cells or across components within a given amplifying cell.

FIG. 8 illustrates a method of amplifying a low voltage to a high voltage. The method 800 includes receiving a low voltage signal from a signal source (e.g., 301 in FIG. 3) at a first time (Block 802). The method 800 further includes powering a chain of low-voltage amplifiers via DC-DC converters that isolate the low-voltage amplifiers from a power supply (Block 804). These low-voltage amplifiers include any number of different types of amplifiers such as those shown as 302, 304, and 306 in FIG. 3, or 402, 404, 406 in FIG. 4. An exemplary chain 300 is seen in FIG. 3. The method 800 further includes amplifying the low voltage signal via the chain of low-voltage amplifiers coupled in series to provide a high-voltage output signal to a load (e.g., 303 in FIG. 3), wherein the second through $N^{th}-1$ low-voltage amplifiers are floating (Block 806). As seen in FIG. 4 for instance, the first low-voltage amplifier 402 has an input at $V_1$, which may be grounded or held to some non-zero value, but is not floating. In contrast, the second low-voltage amplifier 404 is floating. Further, the last low-voltage amplifiers 406 (or the $N^{th}$ low-voltage amplifiers) would be floating except for being coupled to a ground-referenced circuit such as a load. Thus, the first and last low-voltage amplifiers 402 and 406 are either grounded or held to some non-floating voltage, whereas the low-voltage amplifiers therebetween (i.e., the $2^{nd}$ through the $N^{th}-1$) are floating.

Since applications will often be directed to dynamic low-voltage signals, such as pulsed waveforms, stepped waveforms, and arbitrary waveforms, the method 800 can further include receiving a change in the low-voltage signal from the signal source at a second time (Block 808). In other words, the signal source (e.g., 301 in FIG. 3) can provide a variable output and the signal input 420 in FIG. 4 can be a varying voltage. In FIG. 5, voltages are provided at a certain moment in time and thus the example input of 1V may be different at a second time. The method 800 yet further includes level shifting the low-voltage amplifiers, in response to the change, via feedforward connections (e.g., 310, 314, 316 in FIGS. 3 and 410, 414, 416 in FIG. 4) between inputs of adjacent ones of the low-voltage amplifiers, to provide a correspondingly changed high-voltage output signal to the load (Block 810). Said another way, the feedforward connections allow the cascoded high-voltage amplifier to nearly instantly respond at the output 422 to changes at the input 420.

The method 800 is applicable to any of the cascoded high-voltage amplifiers described in this disclosure, including, but not limited to, those shown in FIGS. 3-6 and 9.

The terms and expressions employed herein are used as terms and expressions of description and not of limitation, and there is no intention, in the use of such terms and expressions, of excluding any equivalents of the features shown and described or portions thereof. Each of the various elements disclosed herein may be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element may be expressed by equivalent apparatus terms or method terms-even if only the function or result is the same. Such equivalent, broader, or even more generic terms should be considered to be encompassed in the description of each element or action. Such terms can be substituted where desired to make explicit the implicitly broad coverage to which this invention is entitled.

As but one example, it should be understood that all action may be expressed as a means for taking that action or as an element which causes that action. Similarly, each physical element disclosed should be understood to encompass a disclosure of the action which that physical element facilitates. Such changes and alternative terms are to be understood to be explicitly included in the description.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

Additional Embodiments

One aspect of the disclosure is a cascoded high-voltage amplifier including a voltage input, a first variable DC source, a second variable DC source, and some number of additional variable DC sources up to an $N^{th}$ variable DC source. Details of this embodiment can be described with reference to FIG. 3. The voltage input 120 can be configured to receive an input voltage, for instance, from the voltage source 101. The first variable DC source 102 can be coupled to the voltage input 120 via first input, for instance, through a resistive device such as 107 that may be part of a voltage divider comprising 107 and 124. The first variable DC source 102 can have a first output. The first variable DC source 102 can have a first gain. It can also be configured to amplify the input voltage and to provide an amplified version of the input voltage and the first output. The second variable DC source 104 can be configured to amplify the first output. The $N^{th}$ variable DC source 106 can be configured to amplify an output of an $N^{th}-1$ variable DC source and to output a high-voltage version of the input voltage at an output 122. The output 122 can be configured for coupling to a load 103. N can be the number of variable DC sources in the cascoded high-voltage amplifier 100. Feedforward connections 110, 114, 116 between adjacent ones of the variable DC sources 102, 104, 106 can level shift subsequent variable DC sources without high-voltage signal isolation along the feedforward connections 110, 114, 116. Traditional amplifying cells typically have an optical isolator or other high-voltage isolating device along any feedback connections spanning different amplifier cells. Such devices add to the cost and complexity of an amplifier and increase latency. Here, because the voltage across any one of the cells 130, 132, 134 is low (e.g., less than 50V), the feedforward connections 110, 114, 116 can be free of high-voltage isolating devices such as optical isolators.

In some instances, the gain of each of the variable DC sources is equal, and in some cases can be substantially 2. The output voltage, or high-voltage version of the input voltage, is N*A times the input voltage, wherein N is the number of variable DC sources in the cascoded high-voltage amplifier, and wherein A is the gain of each variable DC source. To maintain isolation of the various cells 130, 132, 134, they are also isolated from a power supply 140 and more specifically, powered by voltage sources that are isolated from ground, for instance, via the isolation devices shown in FIG. 3. These isolation devices are transformers in one embodiment, but are not limited to this one example of an isolation device. In some embodiments, the first variable DC source is a voltage buffer or other circuit with a gain of 1, and all other variable DC sources are amplifiers such as op amps. In other embodiments, all of the variable DC sources are amplifiers such as op amps.

One aspect of the disclosure is a cascoded high-voltage amplifier comprising N amplifier cells, a voltage input, and a high voltage output. The N amplifier cells can each have a gain of A. The voltage input can be configured to receive an input voltage. The high voltage output can be configured to provide an N*A times amplified version of the input voltage. A first of the N amplifier cells can take a voltage divided version of the input voltage as one of two inputs. The second amplifier cell can comprise a first input having a first input voltage formed by a first voltage divider that couples to an output of the first amplifier cell and ground, a second input having a second input voltage formed by a second voltage divider that couples to an output of the second amplifier cell and ground. A third amplifier cell can comprise a third input having a third input voltage formed by a third voltage divider that couples to an output of the first amplifier cell and an output of the second amplifier cell, and a fourth input having a fourth input voltage formed by a fourth voltage divider that couples an output of the third amplifier cell and an output of the first amplifier cell. A $N^{th}$ amplifier cell provides the high voltage output.

Another aspect of the disclosure is a cascoded high-voltage amplifier comprising a chain of voltage-controlled voltage sources, the amplifier comprising a voltage input, a first voltage-controlled voltage source, and an N−1 voltage-controlled voltage sources. The voltage input is configured to receive a ground-referenced input signal. The first voltage-controlled voltage source is coupled to the ground-referenced input signal and configured to generate an amplified version of the ground-referenced input signal. The N−1 voltage-controlled voltage sources form a voltage-stepped-chain with the first voltage-controlled voltage source, each producing a level-shifted version of an output of a previous one of the voltage-controlled voltage sources. Level shifting results from a low-voltage feedforward between inputs of adjacent ones of the voltage-controlled voltage sources, The voltage-controlled voltage sources have substantially equal gain A. the high-voltage at the output of the amplifier can be equally split between the N cells or N voltage-controlled voltage sources. Each of the voltage-controlled voltage sources, except the first, are powered by an earth-referenced power supply or a regulated power supply that is isolated from its power source. The first voltage-controlled voltage source can have a grounded power supply. The first voltage-controlled voltage source has an input coupled to ground whereas the N–1 voltage-controlled voltage sources are floating.

What is claimed is:

1. A high-voltage amplifier comprising:

a voltage input configured to receive an input voltage;

a first amplifying cell comprising a first amplifier coupled to the voltage input via a first input and having a first output, configured to amplify the input voltage with a first gain to provide an amplified version of the input voltage at the first output;

a second amplifying cell comprising a second amplifier having a second output and configured to amplify the first output by a second gain, and having a first feedforward connection between the first input of the first amplifier and a first input of the second amplifier; and an $N^{th}$ amplifying cell comprising an $N^{th}–1$ amplifier configured to output a high voltage version of the input voltage, wherein N is a number of amplifying cells, and wherein at least the second and $N^{th}$ amplifying cells are provided power isolated from a grounded source of the power.

2. The amplifier of claim 1, wherein the first and second gain are equal.

3. The amplifier of claim 2, wherein the first and second gain are equal to or greater than 2.

4. The amplifier of claim 1, wherein the first and second amplifier are a same type of amplifier.

5. The amplifier of claim 1, wherein a voltage across any one of the N amplifying cells is less than or equal to 50 volts.

6. The amplifier of claim 1, wherein N is three or more.

7. The amplifier of claim 1, wherein outputs of the amplifying cells see a common current.

8. The amplifier of claim 1, wherein a voltage divider biases a first input of the first voltage-controlled voltage source with a voltage that is part-way between the input and output of the voltage source.

9. The amplifier of claim 1, the output of the first amplifying cell is coupled to an input of the second amplifier via an impedance component.

10. An amplifier comprising:

a voltage input configured to receive an input voltage;

a first variable DC source coupled to the voltage input and having a first output, having a first gain, and configured to amplify the input voltage and to provide an amplified version of the input voltage at the first output;

a second variable DC source configured to amplify the first output;

an $N^{th}$ variable DC source configured to amplify an output of an $N^{th}–1$ variable DC source and to output a high-voltage version of the input voltage, wherein N is a number of variable DC sources, and wherein feedforward connections between adjacent ones of the variable DC sources level shift subsequent variable DC sources in response to changes to the input voltage.

11. The amplifier of claim 10, wherein the first gain is substantially equal to 2.

12. The amplifier of claim 10, wherein the variable DC sources have a common gain.

13. The amplifier of claim 10, wherein the variable DC sources are powered by voltage sources isolated from ground.

14. The amplifier of claim 10, wherein at least the second variable DC source is floating, and the first output of the first variable DC source is coupled to an input of the second variable DC source via an impedance component.

15. A method comprising:

receiving a low-voltage signal from a signal source at a first time;

powering a chain of N low-voltage amplifiers via voltage regulators that are isolated from a power supply of the voltage regulators;

amplifying the low-voltage signal via the chain of low-voltage amplifiers coupled in series to provide a high-voltage output signal to a load, wherein the second through $N^{th}–1$ low-voltage amplifiers are floating;

receiving a change in the low-voltage signal from the signal source at a second time; and level shifting the low-voltage amplifiers, in response to the change, via feedforward connections between inputs of adjacent ones of the low-voltage amplifiers, to provide a correspondingly changed high-voltage output signal to the load.

16. The method of claim 15, wherein a gain of the low-voltage amplifiers is substantially equal to 2.

17. The method of claim 15, wherein a potential difference between an input and an output of any of the low-voltage amplifiers is no greater than 50 volts.

18. The method of claim 15, wherein the feedforward connections include a first impedance component.

19. The method of claim 18, further comprising reducing a voltage from an output of one of the low-voltage amplifiers to an input of a next of the low-voltage amplifiers via a second impedance component.

* * * * *